(12) United States Patent
Lin

(10) Patent No.: US 11,758,691 B2
(45) Date of Patent: Sep. 12, 2023

(54) HEAT DISSIPATION STRUCTURE AND ELECTRONIC DEVICE ADOPTING THE SAME

(71) Applicant: Morningrich Technology Co., Ltd., Kaohsiung (TW)

(72) Inventor: Chiu-Lang Lin, Kaohsiung (TW)

(73) Assignee: MORNINGRICH TECHNOLOGY CO., LTD., Kaohsiung (TW)

( * ) Notice: Subject to any disclaimer, the term of this patent is extended or adjusted under 35 U.S.C. 154(b) by 169 days.

(21) Appl. No.: 17/240,441

(22) Filed: Apr. 26, 2021

(65) Prior Publication Data

US 2021/0337696 A1 Oct. 28, 2021

(30) Foreign Application Priority Data

Apr. 27, 2020 (TW) .................................. 109204988
Mar. 9, 2021 (TW) .................................. 110202467

(51) Int. Cl.
*H05K 7/20* (2006.01)
*H05K 1/02* (2006.01)
*H05K 1/18* (2006.01)

(52) U.S. Cl.
CPC ........... *H05K 7/205* (2013.01); *H05K 1/0204* (2013.01); *H05K 1/185* (2013.01)

(58) Field of Classification Search
CPC ............. H05K 7/2039; H05K 7/20454; H05K 7/20463; H05K 7/20472; H05K 7/205; H05K 7/2089–209; H05K 1/0201–0212; H05K 1/021; H05K 1/029; H05K 1/185; H05K 2201/06–068; H05K 2201/10416; H01L 23/00; H01L 23/373; H01L 23/367; H01L 23/3733; H01L 23/3735; H01L 23/3736; H01L 23/42; H01L 24/16; H01L 24/32; H01L 24/73; H01L 25/00; H01L 2224/73253; H01L 2224/16227; H01L 2224/32245; H01L 2224/32506

See application file for complete search history.

(56) References Cited

U.S. PATENT DOCUMENTS

| | | | | |
|---|---|---|---|---|
| 4,323,914 A | * | 4/1982 | Berndlmaier | ....... H01L 23/3121 257/E23.125 |
| 7,440,281 B2 | * | 10/2008 | Bailey | ..................... H01L 23/26 360/97.12 |
| 2006/0071324 A1 | * | 4/2006 | Lu | ........................ B81C 1/00269 257/704 |
| 2006/0118925 A1 | * | 6/2006 | Macris | .................... H01L 23/26 257/667 |
| 2006/0120051 A1 | * | 6/2006 | Macris | .................... H01L 24/32 257/E23.137 |

(Continued)

*Primary Examiner* — Amir A Jalali

(74) *Attorney, Agent, or Firm* — Muncy, Geissler, Olds & Lowe, P.C.

(57) ABSTRACT

A heat dissipation structure adapted to dissipate heat from a heat-generating structure includes a heat dissipation unit and a liquid metal layer. The heat dissipation unit includes a heat dissipation body and an anti-corrosion metal layer formed on the heat dissipation body. The liquid metal layer is disposed between the heat-generating structure and the anti-corrosion metal layer, and is opposite to the heat dissipation body. An electronic device that adopts the heat dissipation structure is also disclosed.

13 Claims, 10 Drawing Sheets

(56) References Cited

U.S. PATENT DOCUMENTS

| | | | |
|---|---|---|---|
| 2006/0131738 A1* | 6/2006 | Furman | H01L 23/3737 |
| | | | 257/E23.087 |
| 2008/0137300 A1* | 6/2008 | Macris | H01L 23/433 |
| | | | 257/E23.09 |
| 2008/0165502 A1* | 7/2008 | Furman | H01L 23/433 |
| | | | 257/E23.09 |
| 2009/0146294 A1* | 6/2009 | Hillman | H01L 23/42 |
| | | | 257/714 |
| 2011/0240279 A1* | 10/2011 | Furman | H01L 23/427 |
| | | | 428/673 |
| 2011/0292613 A1* | 12/2011 | Deng | H01L 23/3736 |
| | | | 361/720 |
| 2019/0221498 A1* | 7/2019 | Wu | H01L 23/433 |
| 2021/0125896 A1* | 4/2021 | Arrington | H01L 23/42 |
| 2021/0134698 A1* | 5/2021 | Arrington | H01L 25/0655 |

* cited by examiner

HEAT DISSIPATION STRUCTURE AND ELECTRONIC DEVICE ADOPTING THE SAME

CROSS-REFERENCE TO RELATED APPLICATION

This application claims priority of Taiwanese Utility Model Patent Application No. TW109204988U filed on Apr. 27, 2020 and Taiwanese Utility Model Patent Application No. TW110202467U filed on Mar. 9, 2021.

FIELD

The disclosure relates to a heat dissipation structure and an electronic device adopting the same, and more particularly to a heat dissipation structure adapted to dissipate heat from a heat-generating structure and an electronic device adopting the same.

BACKGROUND

A liquid metal is a metal or a metal alloy that is in a liquid state at room temperature due to its low melting point or that is in a liquid state when heated to its melting point. Some examples of liquid metal include gallium indium tin alloy, indium bismuth tin alloy, and indium bismuth zinc alloy. Liquid metals have high stability and exceptional thermal and electrical conductivity. Moreover, the specific heat capacity and thermal conductivity of the liquid metals are much higher than those of the traditional silicone conductive pastes, so that they are now used as a thermal conductive agent between a heat source and heat-dissipating fins or thermal modules.

Aluminum or copper is often used as the main material for heat-dissipating fins or thermal modules. However, aluminum is easily corroded by gallium in the liquid metal, resulting in the damage of the heat-dissipating fins and losing the thermal conductivity of the liquid metal. On the other hand, compared to aluminum, copper has a much stable electron configuration due to the 10 electrons in its 3d orbital, and thus, copper does not corrode as easily as aluminum when in contact with gallium. Referring to FIG. 1, in actual practice, after a period of time and under high temperature, copper can still react with gallium to form a needle-like intermetallic compound CuGa, which is also known as liquid metal dry-out. This kind of intermetallic compound will continue to accumulate and thicken under long term use, as shown in FIGS. 2 to 4, and finally cause the liquid metal to lose its thermal and electrical conductivity. Further, if the liquid metal comes into contact with an electronic component or substrate, it is also easy to cause short circuit damage.

SUMMARY

Therefore, an object of the present disclosure is to provide a heat dissipation structure and an electronic device adopting the same that can alleviate at least one of the drawbacks of the prior art.

According to a first aspect of the present disclosure, there is provided a heat dissipation structure adapted to dissipate heat from a heat-generating structure. The heat dissipation structure includes a heat dissipation unit and a liquid metal layer. The heat dissipation unit includes a heat dissipation body and an anti-corrosion layer formed on the heat dissipation body. The liquid metal layer is disposed between the heat-generating structure and the anti-corrosion layer, and is opposite to the heat dissipation body.

According to a second aspect of the present disclosure, there is provided an electronic device which includes a heat-generating structure and a heat dissipation structure. The heat dissipation structure includes a heat dissipation unit and a liquid metal layer. The heat dissipation unit includes a heat dissipation body and an anti-corrosion layer formed on the heat dissipation body. The liquid metal layer is disposed between the heat-generating structure and the anti-corrosion layer, and is opposite to the heat dissipation body.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
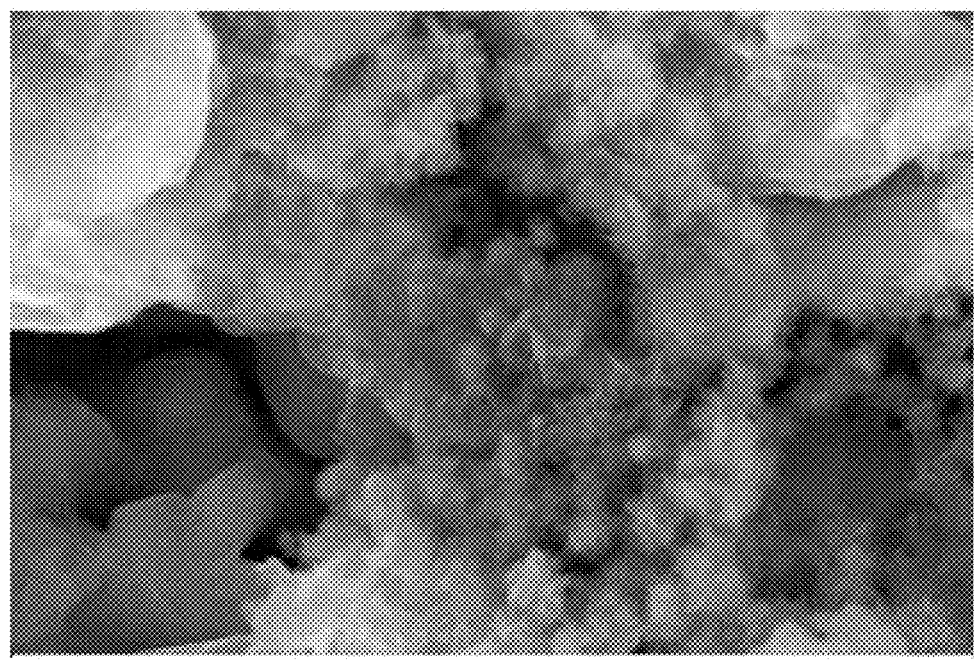
FIG. 1 is a scanning electron microscope (SEM) image of a crystalline phase of a needle-like copper-gallium compound.
Figure 2:
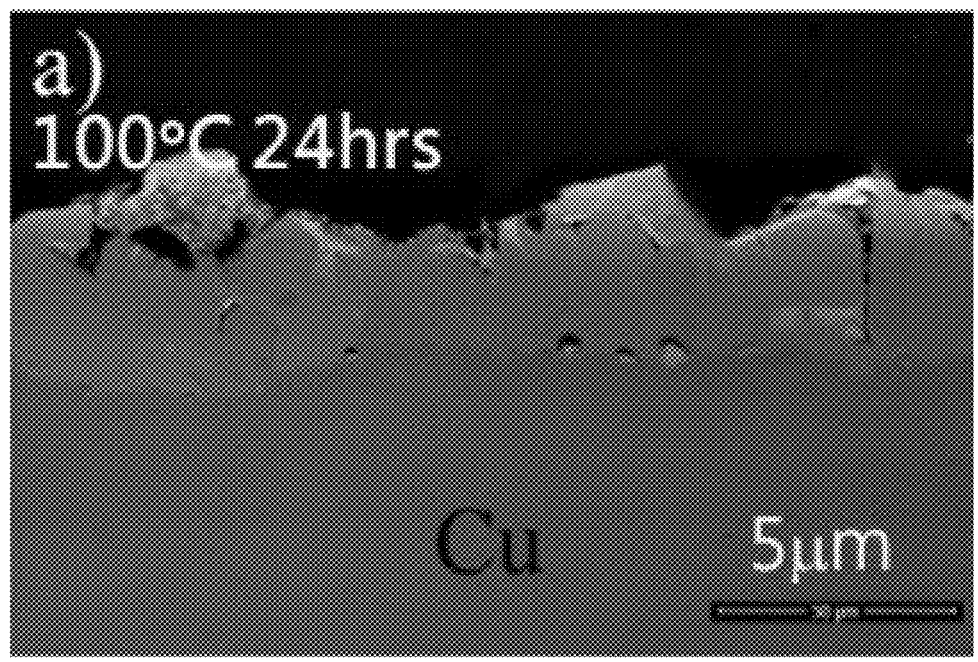
FIGS. 2 to 4 illustrate an accumulation process of the copper-gallium compound.
Figure 3:
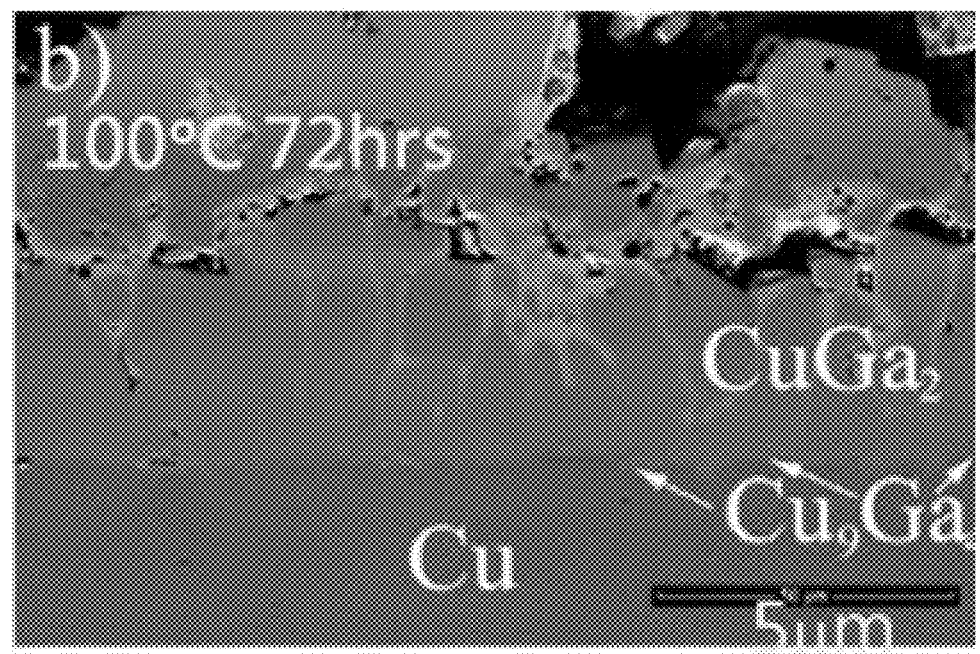
Figure 4:
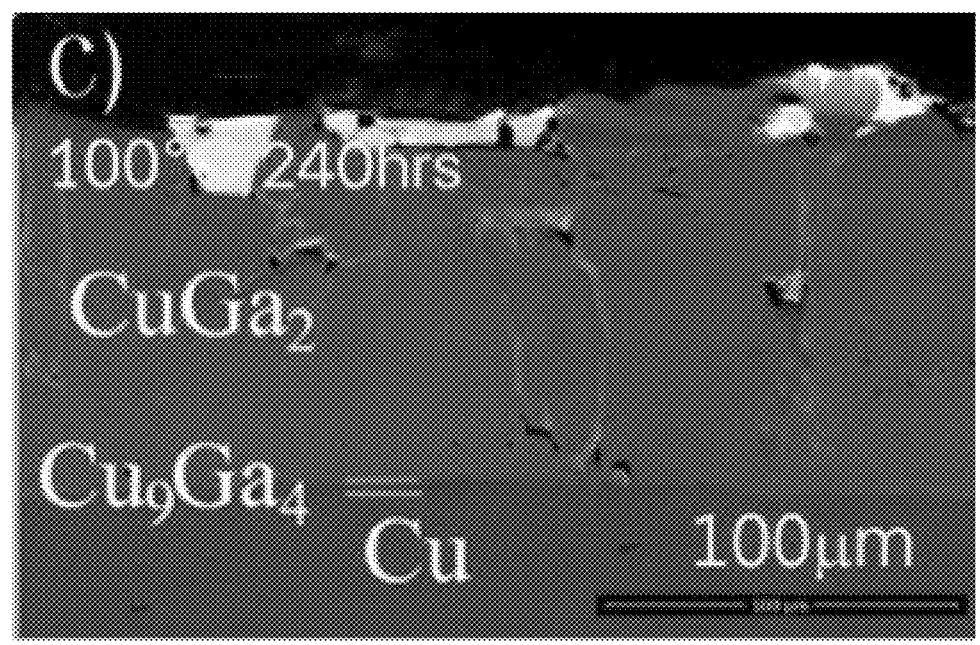

Before the disclosure is described in greater detail, it should be noted that where considered appropriate, reference numerals or terminal portions of reference numerals have been repeated among the figures to indicate corresponding or analogous elements, which may optionally have similar characteristics.

In the present disclosure, a heat dissipation structure 1 is provided for dissipating heat from a heat-generating structure 2. The heat dissipation structure 1 includes a liquid metal layer 11 and a heat dissipation unit 12. The heat dissipation unit 12 includes a heat dissipation body 121 and an anti-corrosion layer 122 formed on the heat dissipation body 121. The liquid metal layer 11 is disposed between the heat-generating structure 2 and the anti-corrosion layer 122, and is opposite to the heat dissipation body 121. In some embodiments, the liquid metal layer 11 is in direct contact with the anti-corrosion layer 122 of the heat dissipation unit 12.

In some embodiments, the heat dissipation body 121 may be made of, but not limited to, copper, aluminum, and alloys thereof.

In some embodiments, the anti-corrosion layer 122 is plated on the heat dissipation body 121 to prevent direct contact between the liquid metal layer 11 and the heat dissipation body 121. In certain embodiments, the anti-corrosion layer 122 is made of metal or ceramic. The metal may be, but not limited to, nickel. Materials for the ceramic may be, but not limited to, silicate, metal oxide (e.g., aluminum oxide, zinc oxide, beryllium oxide, or the like), metal nitride (e.g., aluminum nitride, boron nitride, silicon nitride, or the like), carbide (e.g., silicon carbide, or the like), or metal hydroxide (e.g., aluminum hydroxide). The silicate may be made from feldspar, clay, quartz, or combinations thereof.

In some embodiments, the heat dissipation structure 1 further includes a blocking member 13 that is connected to the anti-corrosion layer 122 and that surrounds the liquid metal layer 11.

Figure 5:
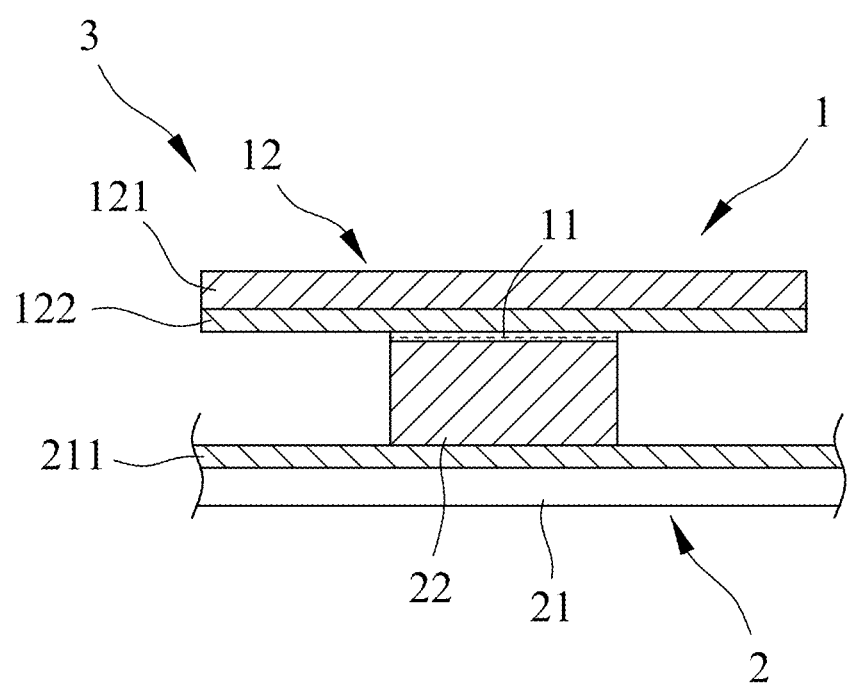
FIG. 5 is a sectional view of a first embodiment of an electronic device according to the present disclosure.

Referring to FIG. 5, a first embodiment of an electronic device 3 that adopts the heat dissipation structure 1 of this disclosure is provided. In this embodiment, the electronic device 3 includes the heat dissipation structure 1 and a heat-generating structure 2. The heat-generating structure 2 includes a substrate 21, and an electronic component 22 disposed on the substrate 21. The heat-generating structure 2 may be, for example, but not limited to, a central processing unit (CPU) or a graphics processing unit (GPU). The substrate 21 includes a printed circuit layer 211 located on top thereof, but is not limited thereto.

The liquid metal layer 11 is disposed between the electronic component 22 and the anti-corrosion layer 122, and is opposite to the heat dissipation body 121. In this embodiment, the liquid metal layer 11 is coated on the electronic component 22, but is not limited thereto. The liquid metal layer 11 may be coated on the anti-corrosion layer 122 or on both of the electronic component 22 and the anti-corrosion layer 122, as long as the liquid metal layer 11 is disposed between the heat-generating structure 2 and the heat dissipation unit 12. Further, in this embodiment, the anti-corrosion layer 122 is plated on the heat dissipation body 121, and is adhered to the liquid metal layer 11 so as to prevent the liquid metal layer 11 from directly contacting the heat dissipation body 121 during heat dissipation, thereby preventing the heat dissipation body 121 from being corroded by the liquid metal layer 11 or forming an intermetallic compound therewith. Thus, damage of the heat dissipation body 121 can be avoided, and the heat dissipation stability of the liquid metal layer 11 can be ensured. The anti-corrosion layer 122 of this embodiment is a nickel layer.

Figure 6:
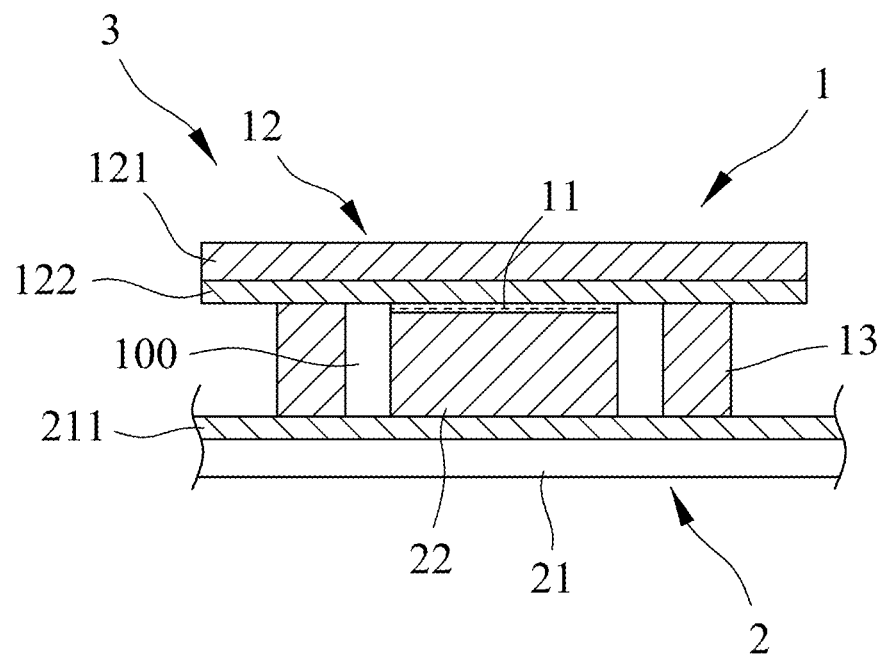
FIG. 6 is a sectional view of a second embodiment of the electronic device of this disclosure.
Figure 7:
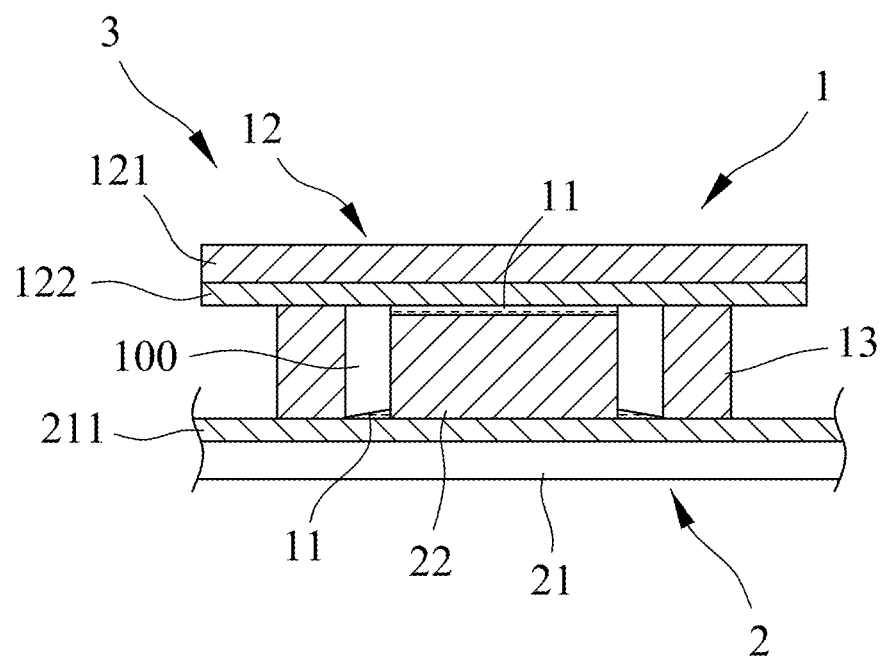
FIG. 7 is a view similar to FIG. 6, but illustrating how a blocking member of the second embodiment works when a liquid metal layer of the second embodiment is squeezed.

Referring to FIGS. 6 and 7, a second embodiment of the electronic device 3 of this disclosure is substantially the same as the first embodiment, except that the electronic device 3 of the second embodiment further includes a blocking member 13 that is disposed between the substrate 21 and the anti-corrosion layer 122, that is connected to the anti-corrosion layer 122, and that surrounds the liquid metal layer 11 and the electronic component 22. The blocking member 13 is spaced apart from the electronic component 22, and may be disposed on the substrate 21 by adherence, latching, or integrating with the substrate 21. Further, the blocking member 13 cooperates with the anti-corrosion layer 122, the substrate 21, and the electronic component 22 to define a receiving space 100. Due to the fluidity of the liquid metal layer 11 and when the liquid metal layer 11 is squeezed, a portion of the liquid metal layer 11 may fall down onto the substrate 21, as shown in FIG. 7. Under the aforesaid circumstance, the blocking member 13 can block and limit the portion of the liquid metal layer 11 within the receiving space 100, preventing the liquid metal layer 11 from short circuiting or corroding other components of the electronic device 3.

Figure 8:
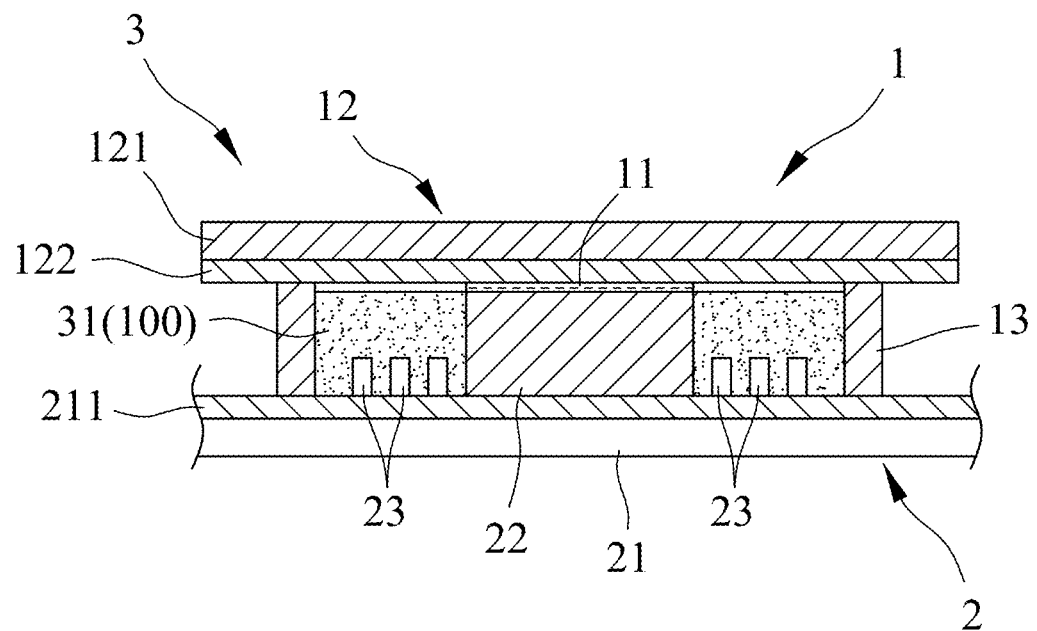
FIG. 8 is a sectional view of a third embodiment of the electronic device of this disclosure.
Figure 9:
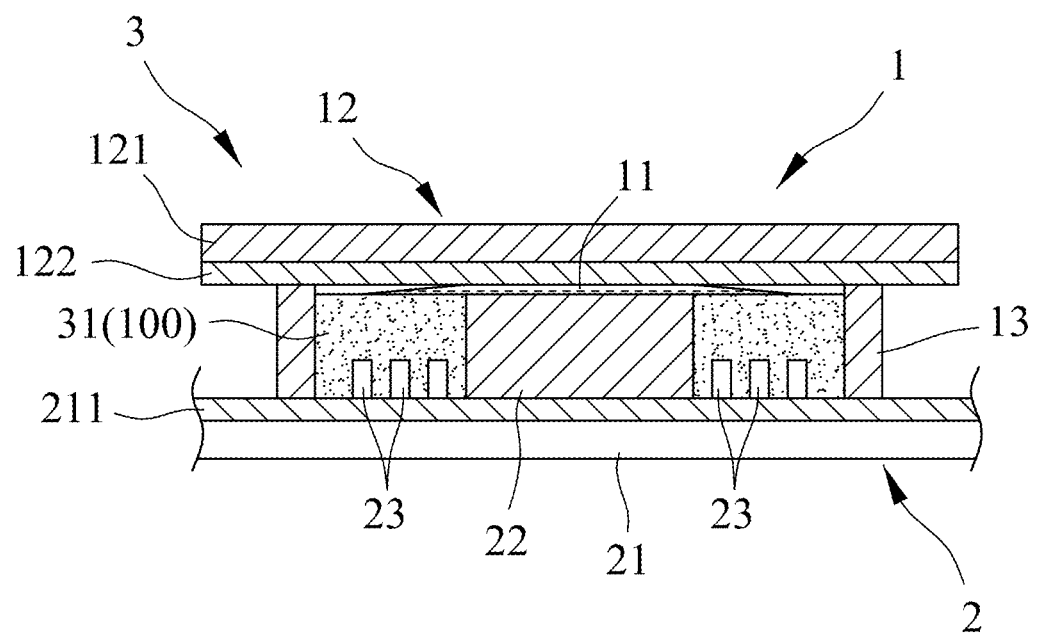
FIG. 9 is a view similar to FIG. 8, but illustrating how a blocking member of the third embodiment works when a liquid metal layer of the third embodiment is squeezed.

Referring to FIGS. 8 and 9, a third embodiment of the electronic device 3 of this disclosure is substantially the same as the second embodiment, except that, in the third embodiment, the heat-generating structure 2 further includes a plurality of electronic elements 23 disposed on the substrate 21 within the receiving space 100, and the electronic device 3 further includes an insulation layer 31 that is disposed in the receiving space 100 and that encapsulates the electronic elements 23. The electronic elements 23 may be capacitors or other components. When the liquid metal layer 11 is squeezed, it will flow into a gap between the insulation layer 31 and the anti-corrosion layer 122, as shown in FIG. 9, and will not be in contact with the electronic elements 23. Thus, the electronic elements 23 are prevented from contacting with the conductive liquid metal layer 11 and short circuiting. The insulation layer 31 may be an insulation paste or glue.

Figure 10:
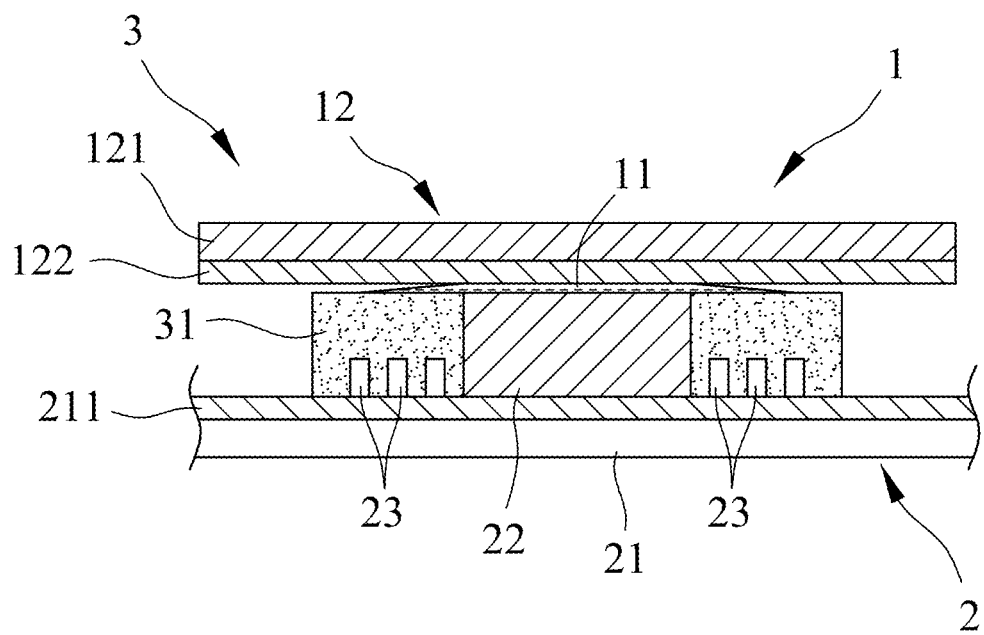
FIG. 10 is a sectional view of a fourth embodiment of the electronic device of this disclosure.

Referring to FIG. 10, a fourth embodiment of the electronic device 3 of this disclosure is substantially the same as the second embodiment, except that the electronic device 3 of the fourth embodiment further includes an insulation layer 31 that is disposed on the substrate 21 and that surrounds the electronic component 22. When the liquid metal layer 11 is squeezed, it will flow into a gap between the insulation layer 31 and the anti-corrosion layer 122, and is prevented from contacting with the substrate 21 or other components of the electronic device 3 and short circuiting.

Figure 11:
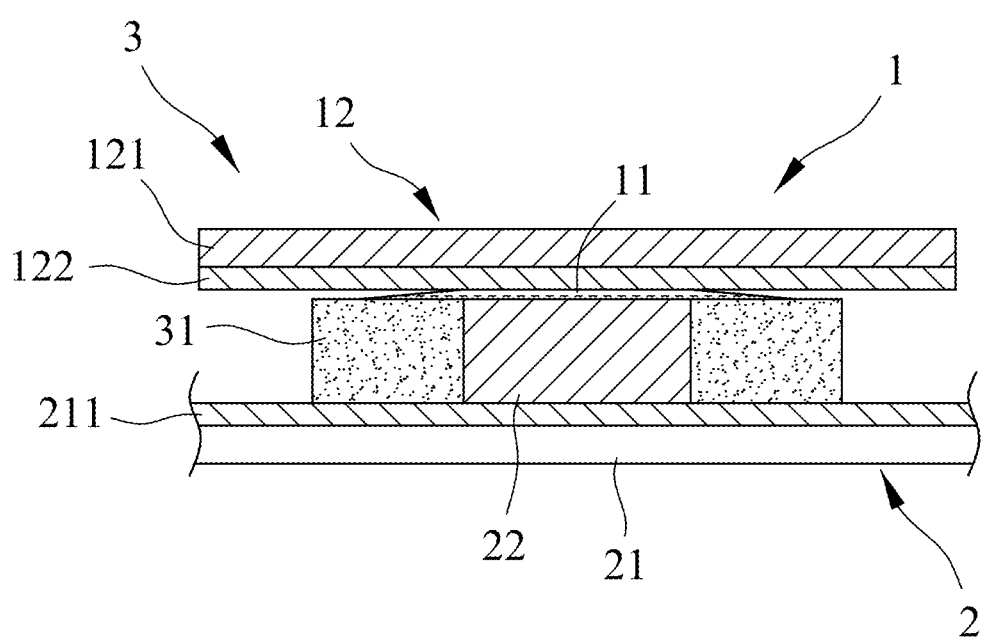
FIG. 11 is a sectional view of a fifth embodiment of the electronic device of this disclosure.

Referring to FIG. 11, a fifth embodiment of the electronic device 3 of this disclosure is substantially the same as the fourth embodiment, except that the heat-generating structure 2 of the fifth embodiment further includes a plurality of electronic elements 23 that are disposed on the substrate 21, that surround the electronic component 22, and that are encapsulated by the insulation layer 31.

Figure 12:
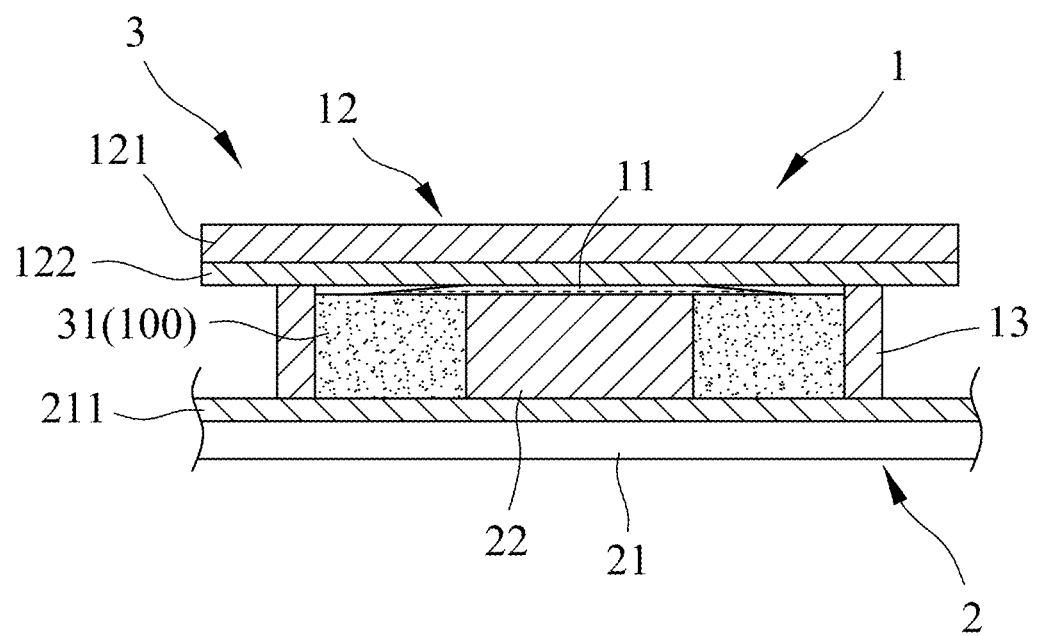
FIG. 12 is a sectional view of a sixth embodiment of the electronic device of this disclosure.

Referring to FIG. 12, a sixth embodiment of the electronic device 3 of this disclosure is substantially the same as the second embodiment, except that the electronic device 3 of the sixth embodiment further includes an insulation layer 31 disposed on the substrate 21 within the receiving space 100 and surrounding the electronic component 22. When the liquid metal layer 11 is squeezed, it will flow into a gap between the insulation layer 31 and the anti-corrosion layer 122, and is prevented from contacting with the substrate 21 or other components of the electronic device 3 and short circuiting.

Figure 13:
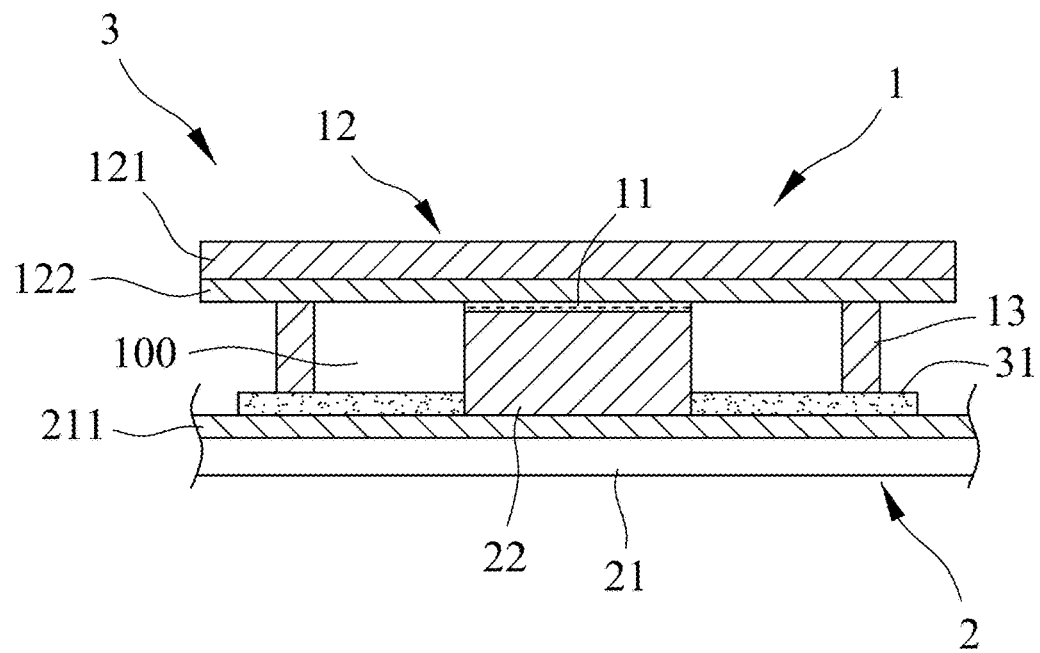
FIG. 13 is a sectional view of a seventh embodiment of the electronic device of this disclosure.
Figure 14:
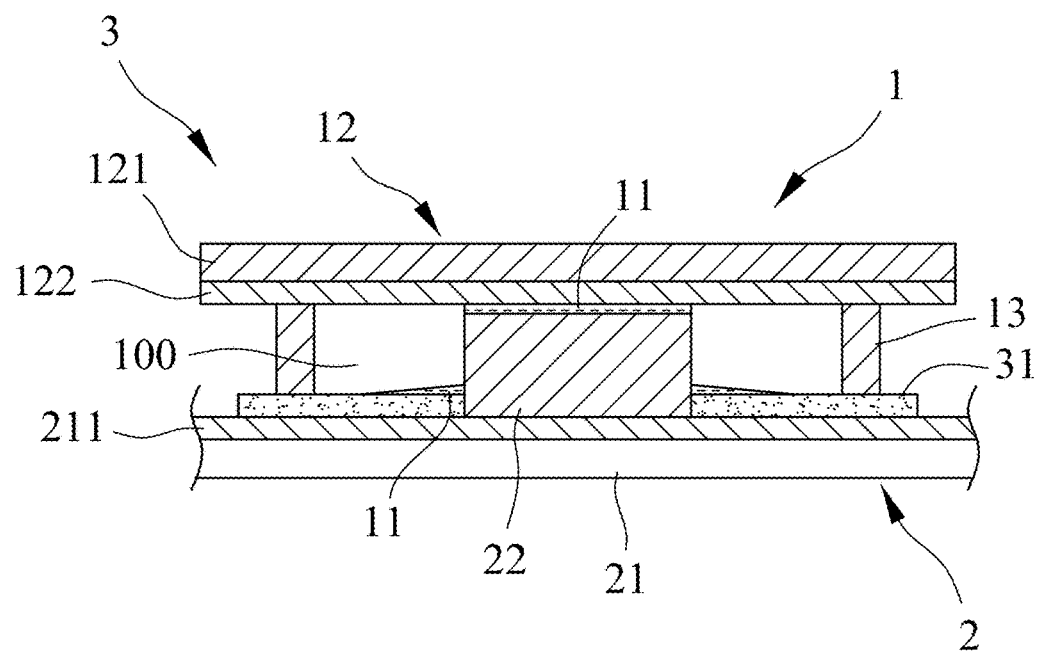
FIG. 14 is a view similar to FIG. 13, but illustrating how a blocking member of the seventh embodiment works when a liquid metal layer of the seventh embodiment is squeezed.

Referring to FIGS. 13 and 14, a seventh embodiment of the electronic device 3 of this disclosure is substantially the same as the first embodiment, except that, in the seventh embodiment, the electronic device 3 further includes an insulation layer 31 that is disposed on the substrate 21 and that surrounds the electronic component 22, and the heat dissipation structure 1 further includes a blocking member 13 connected between the insulation layer 31 and the anti-corrosion layer 122 and surrounding the liquid metal layer 11 and the electronic component 22. The blocking member 13 cooperates with the anti-corrosion metal layer 122, the insulation layer 31, and the electronic component 22 to define a receiving space 100. When the liquid metal layer 11 is squeezed, a portion of the liquid metal layer 11 will fall down onto the insulation layer 31 within the receiving space 100, and is prevented from contacting with the substrate 21 or other components of the electronic device 3 and short circuiting.

Figure 15:
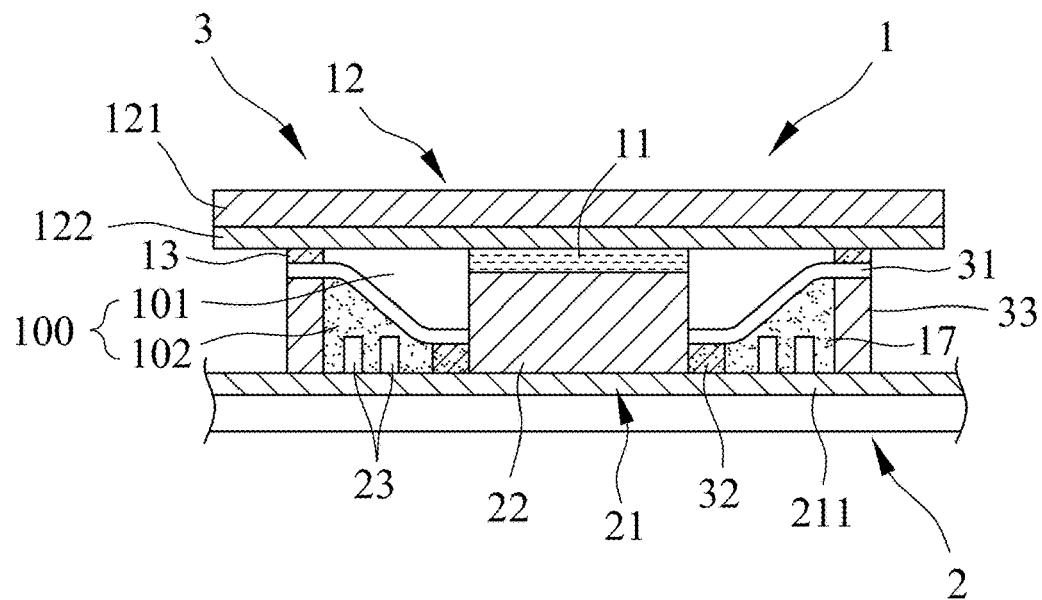
FIG. 15 is a sectional view of an eighth embodiment of the electronic device of this disclosure.
Figure 16:
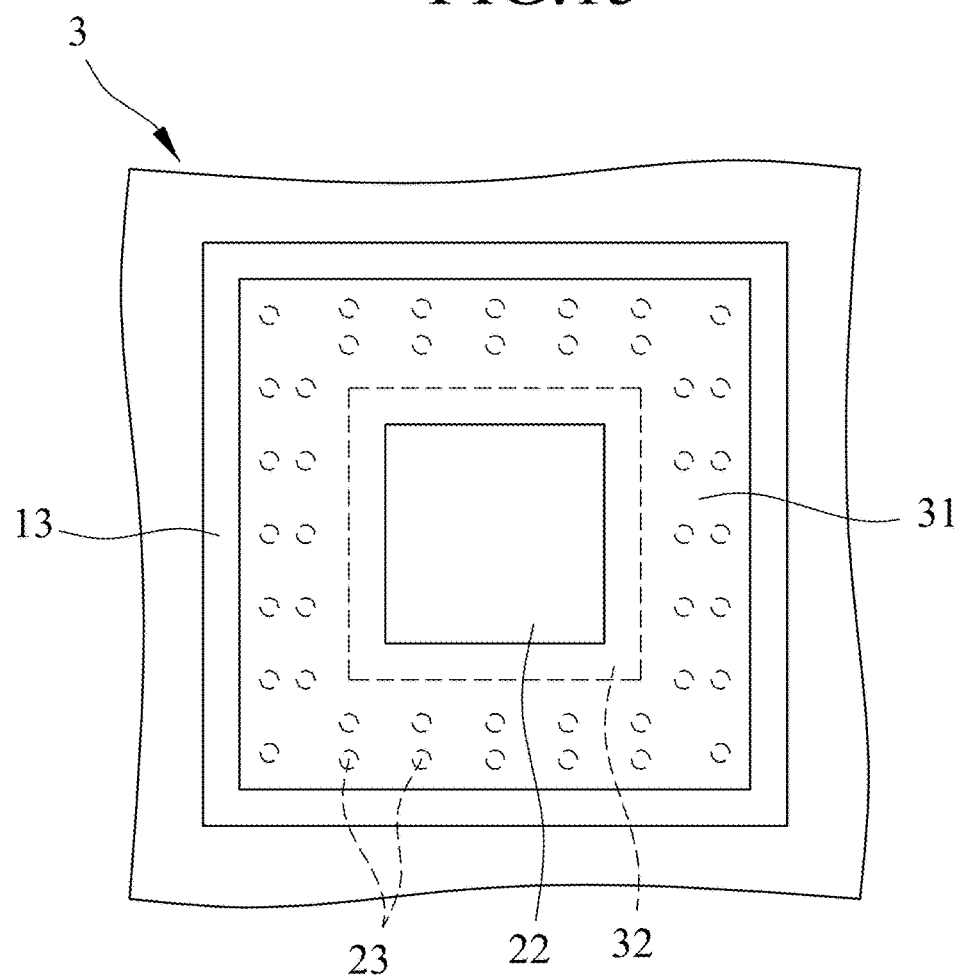
FIG. 16 is a top view of the eighth embodiment.
Figure 17:
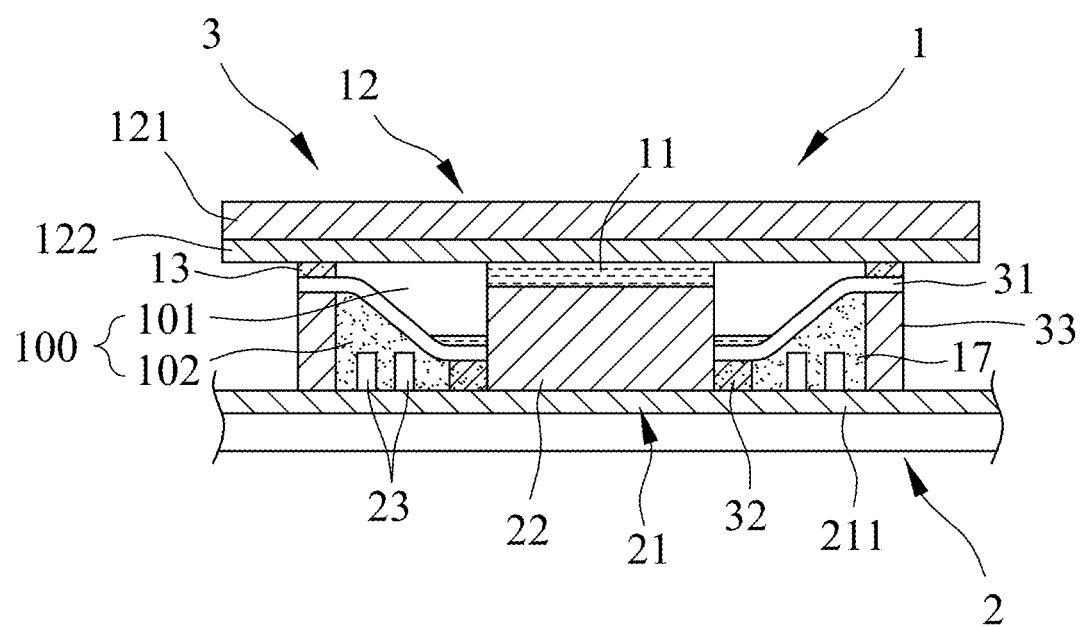
FIG. 17 is a sectional view illustrating how the eighth embodiment provides protection for the electronic device against corrosion by liquid metal.

Referring to FIGS. 15 to 17, an eighth embodiment of the electronic device 3 of this disclosure is substantially the same as the second embodiment. However, in the eighth embodiment, the heat-generating structure 2 further includes at least one electronic element 23 that is disposed on the substrate 21. The electronic device 3 of this embodiment further includes a fixing adhesive 32, an insulation layer 31, and a stiffener ring 33. The stiffener ring 33 is disposed between the substrate 21 and the anti-corrosion layer 122, and is connected to the substrate 21. In certain embodiments, the stiffener ring 33 is disposed between the substrate and the insulation layer 31. The at least one electronic element 23 is located between the electronic component 22 and the stiffener ring 33. The fixing adhesive 32 is disposed on the substrate 21, and is located between the electronic component and the electronic elements 23. The insulation layer 31 extends from the stiffener ring 33 to the fixing adhesive 32, and divides the receiving space 100 into an upper receiving portion 101 and a lower receiving portion 102. The upper receiving portion 101 is defined by the insulation layer 31, a portion of the electronic component 22, the blocking member 13, and the anti-corrosion layer 122. The lower receiving portion 102 is defined by the insulation layer 31, the fixing adhesive 32, the stiffener ring 33, and the substrate 21. The fixing adhesive 32 and the at least one electronic element 23 are located in the lower receiving portion 102, and are covered by the insulation layer 31. The blocking member 13 is disposed and clamped between the insulation layer 31 and the anti-corrosion layer 122. It should be noted herein that, in this embodiment, an insulation paste or glue 17 may be provided in the lower receiving portion 102 and may encapsulate the electronic elements 23 to enhance the effect of insulating the at least one electronic element 23.

In this embodiment, the fixing adhesive 32 has a square shape, and surrounds the electronic component 22, as shown in FIG. 16. The fixing adhesive 32 is a polymeric material, preferably double-sided tape and with an upper surface adhered to the insulation layer 31 and a lower surface adhered to the substrate 21. The insulation layer 31 is an insulation film. In this embodiment, the insulation layer 31 has an inner side connected to the fixing adhesive 32 and an outer side connected to the stiffener ring 33. Further, the insulation layer 31 is located above the electronic elements 23 in order to cover the same. In certain embodiments, the blocking member 13 is a polymeric material, and the polymeric material may be a foam tape. In certain embodiment the blocking member 13 is a cushioning adhesive. The blocking member 13 has a lower surface adhered to the outer side of the insulation layer 31 and an upper surface adhered to the anti-corrosion layer 122.

When the liquid metal layer 11 is squeezed and a portion thereof flows down onto the insulation layer 31 within the upper receiving portion 101, as shown in FIG. 17, the liquid metal layer 11 is prevented from contacting the electronic elements 23 and the substrate 21 through the blocking of the insulation layer 31, the blocking member 13, and the fixing adhesive 32, so that the electronic elements 23 and other components of the electronic device 3 can be prevented from short circuiting and being damaged.

Installation and locations of the fixing adhesive 32, the insulation layer 31, and the blocking member 13 are not limited to the disclosure, and can be subject to change according to the different configurations of the heat-generating structure 2.

In view of the aforesaid, by forming an anti-corrosion layer 122 on the heat dissipation body 121 of the heat dissipation unit 12, the anti-corrosion layer 122 can prevent direct contact between the liquid metal layer 11 and the heat dissipation body 121, so that reaction and corrosion between the two can be avoided, thereby improving the stability and durability of the heat dissipation structure 1 of this disclosure. Moreover, by providing the blocking member 13 and the insulation layer 31 in the electronic device 3, the liquid metal layer 11 can be prevented from flowing out and damaging the electronic device 3.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic device, comprising:
a heat-generating structure including a substrate and an electronic component disposed on said substrate; and
a heat dissipation structure including
a heat dissipation unit that includes a heat dissipation body and an anti-corrosion layer formed on said heat dissipation body (121),
a liquid metal layer disposed between said electronic component and said anti-corrosion layer and opposite to said heat dissipation body, and
a blocking member that is disposed between said substrate and said anti-corrosion layer, that is connected to said anti-corrosion layer, and that surrounds said liquid metal layer and said electronic component.

2. The electronic device as claimed in claim 1, wherein: said heat-generating structure further includes at least one electronic element that is disposed on said substrate and that is located between said electronic component and said blocking member; and said electronic device further comprises an insulation layer that is disposed on said substrate and that encapsulates said at least one electronic element.

3. The electronic device as claimed in claim 1, wherein:
said heat-generating structure further includes at least one electronic element that is disposed on said substrate;
said electronic device further comprises
- a stiffener ring that is disposed between said substrate and said anti-corrosion layer, and that is connected to said substrate, said electronic element being located between said electronic component and said stiffener ring;
- a fixing adhesive that is disposed on said substrate and that is located between said electronic component and said at least one electronic element; and
- an insulation layer that extends from said stiffener ring to said fixing adhesive and that covers said at least one electronic element, said blocking member being disposed between said insulation layer and said anti-corrosion layer.

4. The electronic device as claimed in claim 3, further comprising an insulation glue disposed between said insulation layer and said substrate.

5. The electronic device as claimed in claim 3, wherein said fixing adhesive is a polymeric material.

6. The electronic device as claimed in claim 5, wherein said fixing adhesive is double-sided tape.

7. The electronic device as claimed in claim 3, wherein said blocking member is a polymeric material.

8. The electronic device as claimed in claim 7, wherein said blocking member is foam tape.

9. The electronic device as claimed in claim 1, wherein said anti-corrosion layer is made of metal or ceramic.

10. The electronic device as claimed in claim 1, wherein said heat dissipation body is made of copper, aluminum, or alloys thereof.

11. An electronic device, comprising:
- a heat-generating structure including a substrate and an electronic component disposed on said substrate;
- a heat dissipation structure including
  - a heat dissipation unit that includes a heat dissipation body and an anti-corrosion layer formed on said heat dissipation body,
  - a liquid metal layer disposed between said electronic component and said anti-corrosion layer and opposite to said heat dissipation body; and
- an insulation layer that is disposed on said substrate and that surrounds said electronic component,
wherein said heat dissipation structure further includes a blocking member that is disposed between said substrate and said anti-corrosion layer and that surrounds said liquid metal layer, said electronic component, and said insulation layer.

12. The electronic device as claimed in claim 11, wherein said anti-corrosion layer is made of metal or ceramic.

13. The electronic device as claimed in claim 11, wherein said heat dissipation body is made of copper, aluminum, or alloys thereof.

* * * * *